(12) United States Patent
Holmes

(10) Patent No.: US 6,373,269 B1
(45) Date of Patent: *Apr. 16, 2002

(54) CIRCUIT BOARD PARTICULARLY ADAPTED FOR USE WITH HIGH DENSITY TEST POINT IN-CIRCUIT TESTERS

(76) Inventor: Frederick J. Holmes, 71 Grove St., Plainville, MA (US) 02762

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/415,745

(22) Filed: Oct. 12, 1999

Related U.S. Application Data
(60) Provisional application No. 60/103,935, filed on Oct. 13, 1998.

(51) Int. Cl.[7] .................. G01R 31/02; H01H 31/02; B25B 27/14
(52) U.S. Cl. ................ 324/760; 324/537; 324/754; 324/758; 361/748; 29/280
(58) Field of Search ................. 324/761, 760, 324/537, 754, 758; 361/748; 29/280

(56) References Cited

U.S. PATENT DOCUMENTS

| | | | | |
|---|---|---|---|---|
| 4,707,657 A | * | 11/1987 | Boegh-Petersen | 324/537 |
| 4,833,402 A | * | 5/1989 | Boegh-Petersen | 324/754 |
| 5,003,273 A | * | 3/1991 | Oppenberg | 333/1 |
| 5,144,742 A | * | 9/1992 | Lucas et al. | 29/830 |
| 5,154,546 A | * | 10/1992 | Neumann et al. | 408/1 R |
| 5,357,400 A | * | 10/1994 | Takekawa | 361/704 |
| 5,544,773 A | * | 8/1996 | Haruta et al. | 216/13 |
| 5,576,630 A | * | 11/1996 | Fujita | 324/760 |
| 5,829,124 A | * | 12/1998 | Kresge et al. | 29/840 |
| 6,140,830 A | * | 10/2000 | Ott | 324/761 |

* cited by examiner

Primary Examiner—Glenn W. Brown
Assistant Examiner—Wasseem H. Hamdan
(74) Attorney, Agent, or Firm—John A. Haug

(57) ABSTRACT

An interface circuit board (20) for high test point density electronic testing equipment has a first thickness signal portion (20c) in which all the signal traces (20e) are routed and a second, thicker integrally formed transfer portion (20d) which transfers the signal traces to a respective test pad (20g) on the lower surface of the transfer portion. The transfer portion is made thicker to strengthen the board and is made integral with the first signal portion to eliminate the need for intermediate solder joints.

2 Claims, 2 Drawing Sheets

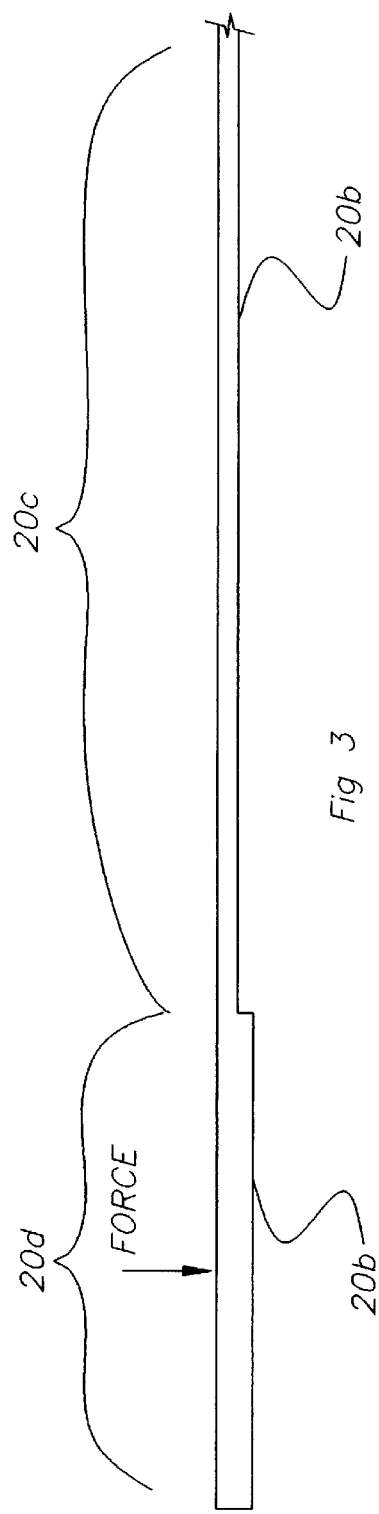
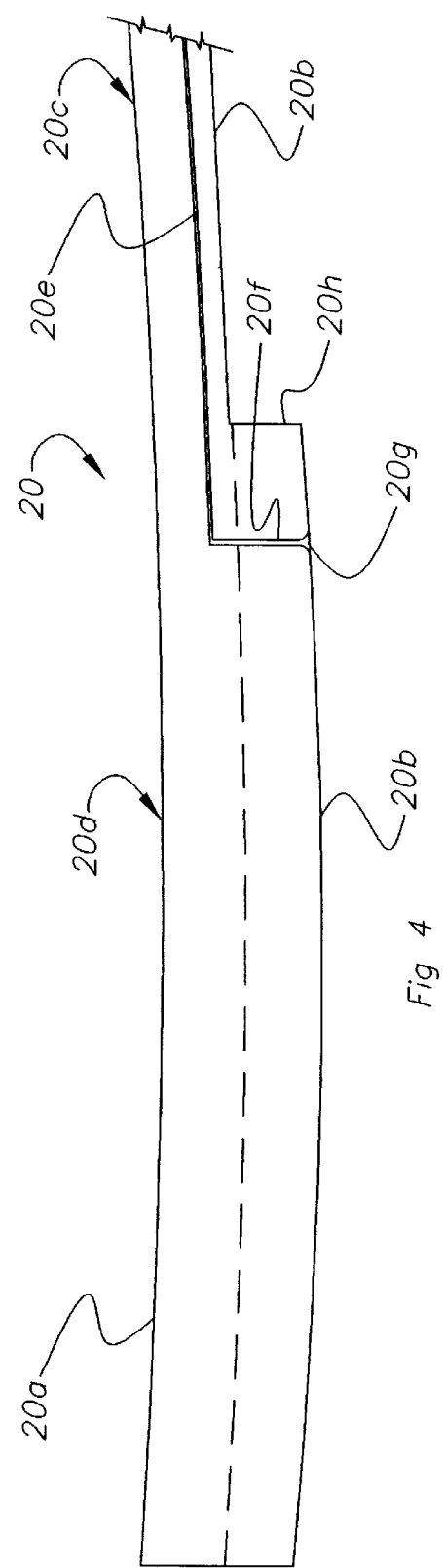

CIRCUIT BOARD PARTICULARLY ADAPTED FOR USE WITH HIGH DENSITY TEST POINT IN-CIRCUIT TESTERS

CROSS REFERENCES TO RELATED APPLICATIONS

Benefit is claimed of U.S. provisional application No. 60/103,935, filed Oct. 13, 1998.

FIELD OF THE INVENTION

This invention relates generally to electronic testing equipment and more particularly circuit boards used for interfacing a plurality of test points in such equipment.

BACKGROUND OF THE INVENTION

With the increase in test point density test equipment, manufacturers have introduced in-circuit testers that interface with seven thousand and more test points. With an average test nail spring pressure of 5.5 oz., the force over a given area can reach 2400 pounds. Of course, this force is distributed over an area determined by the product being tested and the number of test points. In-circuit test fixturing has evolved over the years, from wired fixturing using 26–30 gauge wires to "wireless" test fixturing which uses double ended spring pins and a circuit board to carry any given signal, instead of conventional wiring. Hence, the problem arises of a high density, high force test area flexing the circuit board of a wireless fixture with concomitant continuity and contact problems.

To make certain testers upgradeable and compatible with previous versions, a modification has been designed to add additional test points to a tester and allow earlier "wired" test fixtures to be used. This was accomplished by lowering the location of additional test points. From an interfacing standpoint on a conventional wired test fixture, the conversion was simple. Lower the wirewrap pins to the lower level and continue wiring.

However, high density test points, such as seven thousand and more wires, become a debugging problem. Further, induction problems associated with this many wires in such close proximity to one another becomes problematic.

Wireless test fixturing has been an answer to this problem. Since the average length from product under test to the interface is 2" vs 18" of 28 gauge wire, the multilevel interface becomes a problem with circuit board design and manufacturing. The designs presently being utilized have failed due to intermittent contact to a flex interface printed circuit board and failed solder joints where the connector that transfers the signal to the lower portion of the interface meets with the interface printed circuit board.

SUMMARY OF THE INVENTION

It is an object of the present invention to overcome the limitations of the prior art noted above.

Additional objects and features of the invention will be set forth in part in the description which follows and in part will be obvious from the description. The objects and advantages of the invention may be realized and attained by means of the instrumentalities and combinations particularly pointed out in the appended claims.

Briefly, in accordance with the invention, a lower portion of the interface circuit board is fabricated in unison, i.e., integrally, with the signal portion of the routed signal portion as a single piece which not only strengthens the interface board but also allows for signals to pass through the multithickness board without solder joint failures. The routed signal is passed through the transfer portion through a blind via and then to a test pad where the interface circuit board is connected/interfaced to the testing equipment.

BRIEF DESCRIPTION OF THE DRAWINGS

The accompanying drawings, which are incorporated in and constitute a part of the specification, illustrate preferred embodiments of the invention and, together with the description, serve to explain the objects, advantages and principles of the invention. In the drawings, FIG. 3 is an elevational view of a circuit board made in accordance with the preferred embodiment of the invention, and FIG. 4 is an enlarged cross-sectional portion of the FIG. 3 circuit board taken through a conductive trace.

DETAILED DESCRIPTION OF THE PREFERRED EMBODIMENT

Figure 1:
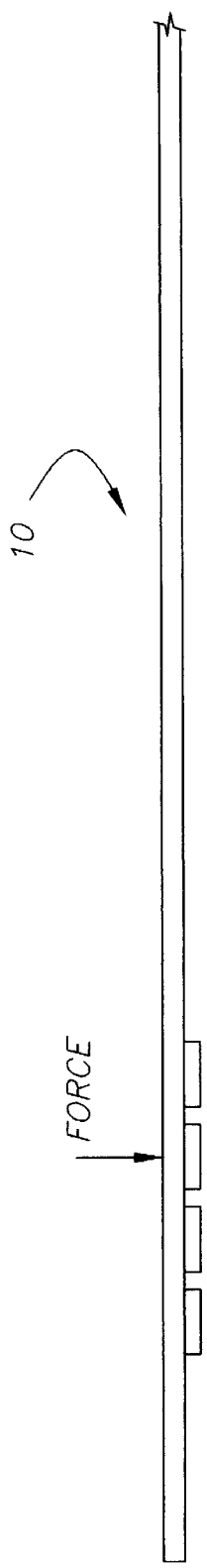
FIG. 1 is an elevational view of a portion of a prior art circuit board.
Figure 2:
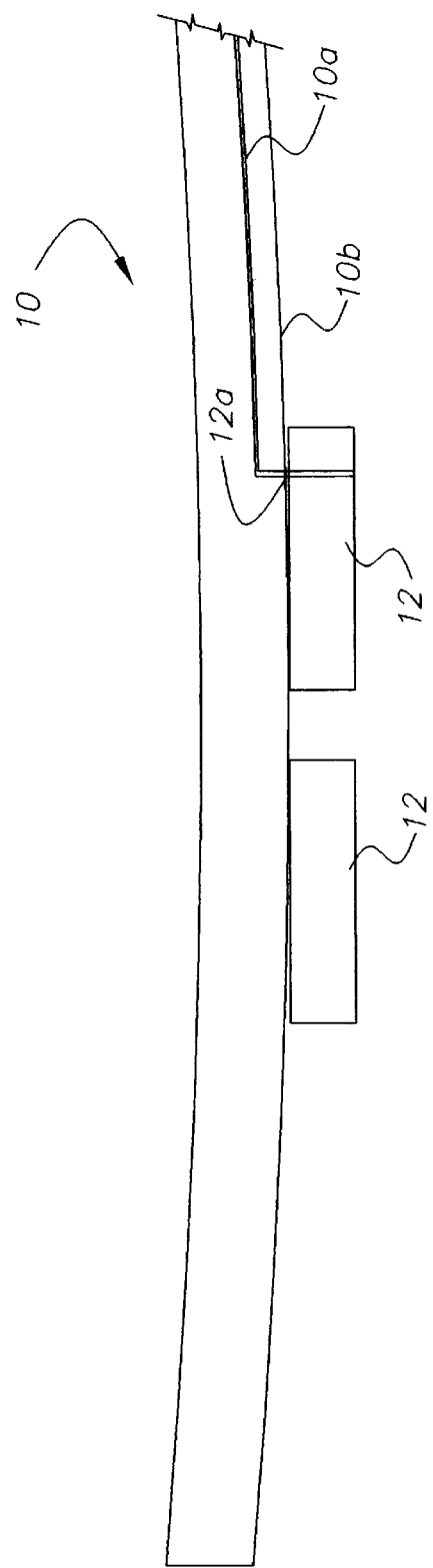
FIG. 2 is an enlarged cross-sectional portion of FIG. 1, taken through a conductive trace.

FIGS. 1 and 2 show a conventional circuit board 10 having a signal trace 10a which extends to an outer face surface 10b where it is interfaced with a connector 12 through a solder joint 12a. Flexing of the circuit board under load at the points of interconnection with connectors 12 lead to solder joint failure and intermittent contacts.

With reference to FIGS. 3 and 4, a multithickness board 20, made in accordance with the preferred embodiment of the invention and using known circuit board laminating techniques, has an upper face surface 20a and a lower face surface 20b and a first signal portion 20c in which are disposed the signal traces 20e (only one being shown for purposes of illustration) which extend in a direction generally parallel to the upper and lower face surfaces to a selected location in a second, stepped, thicker transfer portion 20d at which location it extends at 20f toward one of the lower face surfaces through transfer portion 20d by means of a blind via to a test pad 20g on the lower face surface. The thicker portion 20d, stepped at 20h, provides a stronger interface circuit board as well as one which allows for signals to pass through the multithickness board without the possibility of solder joint failure.

Although the invention has been described with regard to a certain preferred embodiment thereof, variations and modifications will become apparent to those skilled in the art. It is, therefore, the intention that the appended claims be interpreted as broadly as possible in view of the prior art to include all such variations and modifications.

What is claimed:

1. A circuit board for use with a wireless test fixture for interfacing a high density plurality of test points with a device to be tested comprising a body having upper and lower face surfaces, the upper face surface disposed generally in a plane, the body formed of a plurality of electrically insulating layers laminated to one another, the body having a signal portion having a first selected thickness and a second integrally formed signal transfer portion having a second selected thickness greater than the first selected thickness, the circuit board having more than seven thousand test points, a conductive signal trace for each test point having a first portion embedded in the first signal portion and extending in a direction generally parallel to the plane in which the upper face surface is disposed and extending into the second signal transfer portion, a test pad formed on the lower face surface of the second signal transfer portion, each conductive signal trace having a second transfer portion entirely embedded in the body and extending from the respective first portion in a direction toward the lower face and into electrical connection with a test pad to form a test point.

2. A circuit board for use with a wireless test fixture for interfacing a high density plurality of test points with a device to be tested comprising a body having upper and lower face surfaces, the upper face surface disposed generally in a plane, the body formed of a plurality of electrically insulating layers laminated to one another, the body having a signal portion having a first selected thickness and a second integrally formed signal transfer portion having a second selected thickness greater than the first selected thickness, a plurality of test pads formed on the lower surface of the second signal transfer portion, a conductive signal trace for each test pad having a first portion embedded in the first signal portion and extending in a direction generally parallel to the plane in which the upper face surface is disposed and extending into the second signal transfer portion, each conductive signal trace having a second transfer portion entirely embedded in the body and extending from the respective first portion in a direction toward the lower face and into electrical connection with a respective test pad to form a test point.

* * * * *